United States Patent [19]

Weinfurtner

[11] Patent Number: 5,717,770

[45] Date of Patent: *Feb. 10, 1998

[54] PROGRAMMABLE HEARING AID WITH FUZZY LOGIC CONTROL OF TRANSMISSION CHARACTERISTICS

[75] Inventor: Oliver Weinfurtner, Erlangen, Germany

[73] Assignee: Siemens Audiologische Technik GmbH, Erlangen, Germany

[ * ] Notice: The term of this patent shall not extend beyond the expiration date of Pat. No. 5,606,620.

[21] Appl. No.: 393,819

[22] Filed: Feb. 24, 1995

[30] Foreign Application Priority Data

Mar. 23, 1994 [EP] European Pat. Off. ............ 94104618

[51] Int. Cl.⁶ .................................................. H04R 25/00
[52] U.S. Cl. ......................... 381/68.2; 381/68.4; 395/900
[58] Field of Search ........................... 381/60, 68, 68.2, 381/68.4, 56, 94, 98, 103, 106, 107, 86; 395/900

[56] References Cited

U.S. PATENT DOCUMENTS

| | | |
|---|---|---|
| 4,187,413 | 2/1980 | Moser . |
| 4,425,481 | 1/1984 | Mansgold et al. ................... 381/68 |
| 4,508,940 | 4/1985 | Steeger . |
| 4,716,540 | 12/1987 | Yamakawa ........................ 364/807 |
| 5,172,417 | 12/1992 | Iwamura ........................... 381/103 |
| 5,218,542 | 6/1993 | Endo et al. ..................... 364/404.02 |
| 5,292,995 | 3/1994 | Usa .................................... 84/626 |
| 5,351,200 | 9/1994 | Impink, Jr. ....................... 395/900 |
| 5,434,926 | 7/1995 | Watanabe et al. ............... 381/108 |
| 5,604,812 | 2/1997 | Meyer ............................. 381/68.2 |
| 5,606,620 | 2/1997 | Weinfurtner ..................... 381/68.2 |

FOREIGN PATENT DOCUMENTS

| | | |
|---|---|---|
| 0 064 042 | 11/1982 | European Pat. Off. . |
| 0 398 536 | 11/1990 | European Pat. Off. . |
| 4225758 | 2/1994 | Germany . |

*Primary Examiner*—Huyen D. Le
*Attorney, Agent, or Firm*—Hill, Steadman & Simpson

[57] ABSTRACT

A hearing aid with a simplified and optimized control system has control functions that are entirely or partially implemented by a fuzzy logic controller in the amplifier and transmission part circuitry.

17 Claims, 8 Drawing Sheets

PROGRAMMABLE HEARING AID WITH FUZZY LOGIC CONTROL OF TRANSMISSION CHARACTERISTICS

BACKGROUND OF THE INVENTION

1. Field of the Invention

The present invention is directed to a programmable hearing aid of the type having an amplifier and transmission circuit that is adjustable in terms of its transmission properties between a microphone and an earphone to employ one of various transmission characteristics appropriate for current conditions.

2. Description of the Prior Art

European Patent Application 0071845, corresponding to U.S. Pat. No. 4,508,940, discloses a programmable hearing aid in a multi-channel embodiment, wherein an arrangement composed of a plurality of signal branches is arranged following the microphone that receives the input audio signals, each of these signal branches being composed of a frequency-selective filter, a level-dependent gain control and an arrangement for non-linear signal shaping, followed by a summing amplifier that combines the sub-signals and that is connected via an output amplifier to an output signal transducer (earphone).

German OS 27 16 336, corresponding to U.S. Pat. No. 4,187,413, discloses a hearing aid wherein the analog audio signal coming from the microphone is converted into a digital signal in an analog-to-digital converter after passing through a low-pass filter and is supplied to a discrete signal processing circuit whose transfer function of the $n^{th}$ order is formed using parameters stored in an electrically programmable read-only memory (EPROM). The signal processing circuit is controllable with a microprocessor having an arithmetic unit for matching the transfer function to the hearing impairment. The programming can be modified by erasing the read-only memory and by renewed programming. The digital signal modified in this way is then converted into a corresponding analog signal in a digital-to-analog converter, is amplified and is supplied to the earphone.

European Application 0 064 042, corresponding to U.S. Pat. No. 4,425,481, discloses a circuit arrangement for a hearing aid, whereby the parameters of several different environmental situations are stored, for example, in a memory in the hearing aid itself. By actuating a switch, a first group of parameters is called in and, via a control unit, these parameters control a signal processor inserted between microphone and earphone, this signal processor then setting a first transfer function intended for a predetermined environmental situation. The transfer functions of a plurality of stored signal transmission programs can thus be successively called in via a switch until the transfer function that precisely matches the given environmental situation has been found.

It is consequently known to adapt hearing aids to the individual hearing loss of the hearing aid wearer. A setting of the hearing aid for various hearing situations is thereby also provided. Programmable hearing aids offer a plurality of setting parameters that are intended to enable an optimum matching of the electro-acoustic behavior of the hearing aid to the hearing impairment to be compensated.

SUMMARY OF THE INVENTION

An object of the present invention is to provide a programmable hearing aid that has a simplified and optimized control system.

In a programmable hearing aid of the type initially described, this object is inventively achieved by entirely or partially implementing control functions as fuzzy logic controls in the amplifier and transmission circuitry.

With the employment of a fuzzy logic controller in modern, programmable hearing aids, the signal processing functions thereof are improved, especially for adapting the dynamic range of the input signal to the generally restricted dynamic range of the hearing impaired person, since specific control functions can be realized better, or supplemented better, by fuzzy logic components as well as enabling a simpler setting of the controller characteristic. Further, a more targeted introduction of non-linear components into the controller characteristic also becomes possible.

DESCRIPTION OF THE PREFERRED EMBODIMENTS

Figure 1:
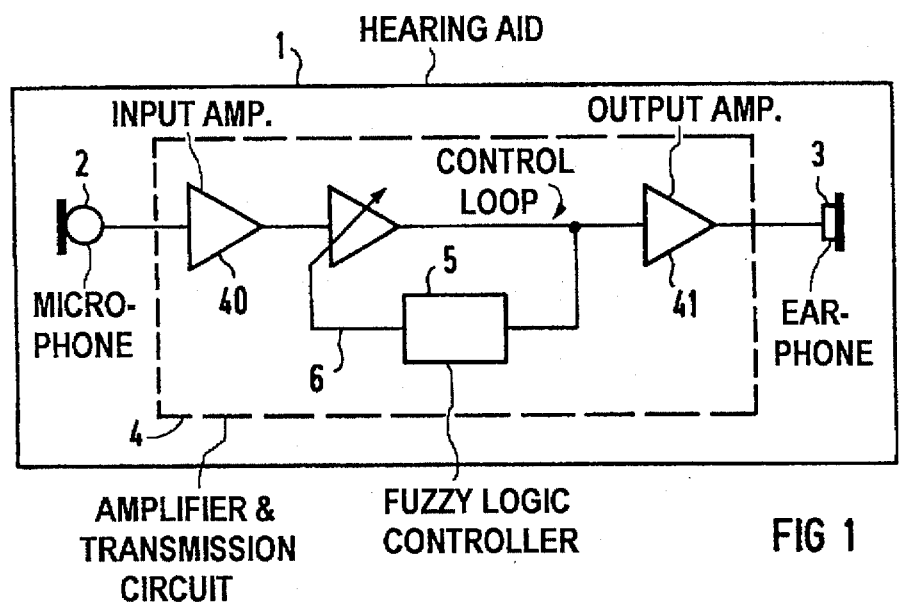
FIG. 1 is a block circuit diagram of a hearing aid of the invention.

The hearing aid has a housing 1 of a size to be worn by a user, such as an ITE housing or a BTE housing. The housing 1 contains all of the components of the invention schematically shown in FIG. 1, including a microphone 2 which picks up audio signals. This acoustic information is converted into electrical signals in the microphone which are amplified in an input amplifier 40. After signal processing in an amplifier and transmission circuit 4, the electrical signal from an output amplifier 41 is supplied to an earphone 3 serving as the output transducer. In the exemplary embodiment, an output quantity to be regulated is tapped and is processed in a control loop 6 with dynamic control (AGC=automatic gain control) in the signal path between the microphone 2 and the earphone 3. This signal processing and control ensues with a fuzzy logic controller 5.

Figure 2:
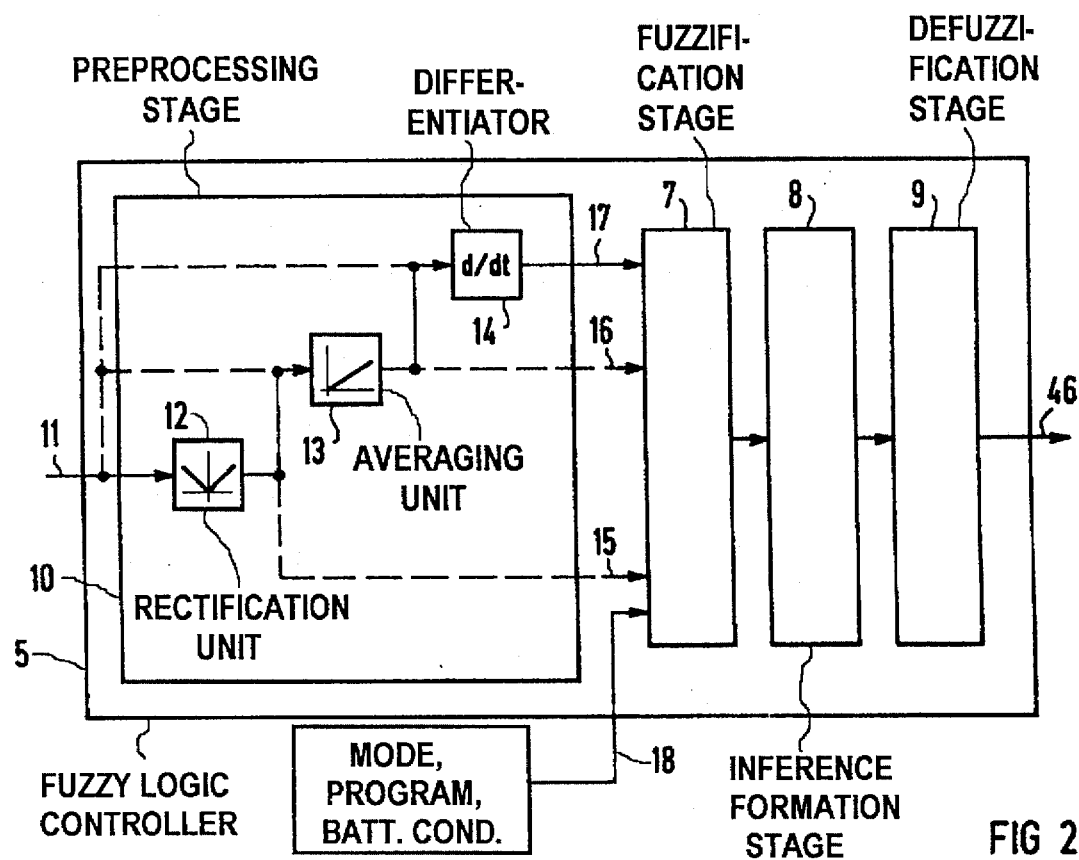
FIG. 2 is a block diagram of the signal preprocessing unit and of the controller for a fuzzy logic control circuit for dynamic gain control (AGC) of a hearing aid according to FIG. 1.

FIG. 2 shows the principle of a fuzzy logic controller for signal processing functions with reference to the example of AGC (automatic gain control) on the basis of the components of a signal preprocessing stage 10 of the fuzzy logic controller 5. Signals 15–17 are acquired from a measured quantity 11 (input signal), for example by means of rectification in a rectification unit 12 and/or an averaging 13 (such as by formation of a temporal average) and/or by forming the time derivative d/dt in a differentiator 14. The processed signals 15–17 are supplied to the fuzzification stage 7 of the fuzzy logic controller 5. As is known, the fuzzification stage 7 of the fuzzy logic controller 5 is followed by an inference forming stage 8 and a defuzzification stage 9.

The set of rules of the fuzzy logic controller 5 is thus not an independent function block but is implemented as a combined functioning of the stages 7–9. The set of rules (if ... then ...-description of the control behavior) is thus substantially invariably contained in the hardware structure of the stages 7–9.

The following, possible generalizations arise from the embodiment of FIG. 2:

The formation of the temporal average (as well as, possibly, of the time derivative) can occur multiply with different time constants in order to be able to specifically react to different fast changes of the signal level.

Likewise, the signal can be directly supplied to the fuzzification stage 7, i.e. without formation of a temporal average, in order to be able to react to signal peaks.

Further signals 18, such as system information signals identifying the hearing program set at the moment (i.e., whether a program has been selected for operation in a noisy or quiet environment) or identifying an operating mode (i.e. whether the microphone or a telephone coil is being used to receive incoming audio signals) set at the hearing aid or for characterizing the battery condition of the hearing aid, can be supplied to the fuzzification stage 7 in order to be able to likewise involve these signals 18 in the controller behavior.

A plurality of input quantities/measured quantities 11 as well as a plurality of output quantities 46 are possible, so that signals at various locations of the overall signal path can be involved in the control, or so that the control can take effect at a plurality of locations in the signal path.

The invention is not limited to the allocation of a fuzzy logic controller 5 for a control circuit 6 having automatic gain control. Without a separate illustration of exemplary embodiments, it is possible that the amplifier and transmission circuit 4 of the hearing aid may include a limiter circuit (PC=peak clipping), and that this peak clipping has a fuzzy logic controller inventively allocated to it. According to a further embodiment, the amplifier and transmission circuit can include an automatic volume control to which a fuzzy logic controller is allocated. Given a programmable hearing aid in multi-channel embodiments, it is possible that variable amplifier and transmission circuits can be provided in the individual frequency channels and fuzzy logic controllers can be allocated to these amplifier and transmission circuits.

The realization of the required fuzzy logic components in the following circuit embodiments ensues in analog circuit technology. Fuzzy logic operations can be simulated as algorithms that are executed in digital arithmetic units and operational units. Particularly due to the limited, small mounting space in hearing aids for the circuit components, the purely digital circuit cannot be implemented without further difficulty given current technologies since the area required for the digital circuit technology on an integrated circuit for hearing aids is usually not available. Moreover, the required power consumption would be too high for a hearing aid, since the digital operational unit would have to work with a higher clock frequency in order to realize all necessary operations in real time. The control of the analog signal processing with a digitally realized controller, further, would lead to a pronounced disruption of the analog signals due to the digital logic elements.

For these reasons, the invention conducts the fuzzy logic operations in analog circuit technology. The arising signals are thereby realized as currents. Well known circuits can be employed for the conversion of voltage signals into current signals and vice versa.

Figure 13:
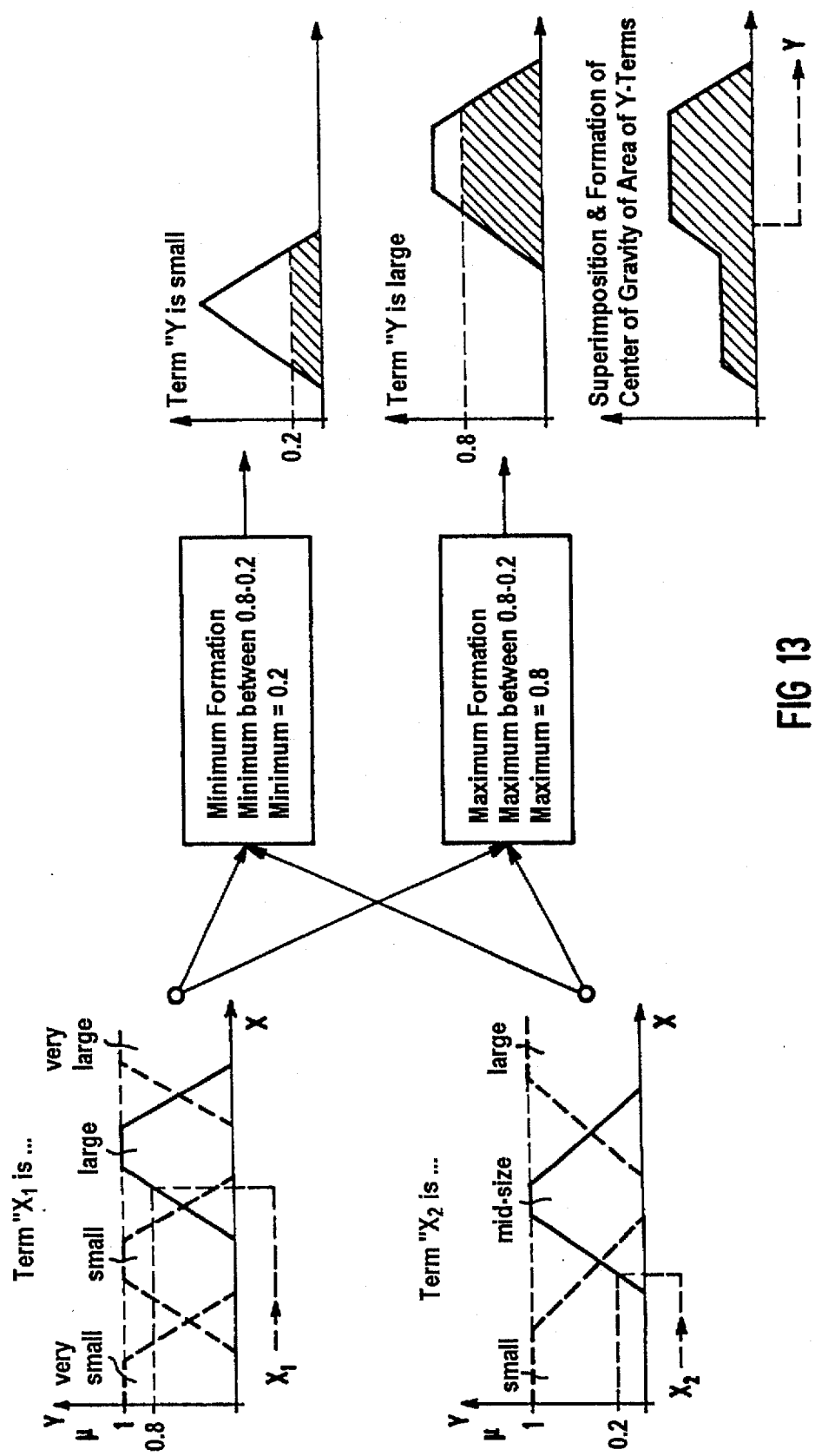
FIG. 13 shows exemplary illustrations of the basic principle for a simple fuzzy logic control unit and its processing as used in the invention.

FIG. 13 shows a simple fuzzy logic set of rules and its fundamental processing. A first step for the implementation of a fuzzy logic structure is the definition of the linguistic variables for its input and output quantities. The terms for each of these quantities are entered relative to a numerical value scale. Variable quantities are shown over the x-axes of the illustrated coordinate axes, whereby the value $\mu$ in the y-axis indicates the degree of satisfaction, or truth, of the respective statement.

The following rule set derives from the example shown in FIG. 13:

1. If $x_1$ is large and $x_2$ is medium (or mid-size) then y is small.
2. If $x_1$ is large or $x_2$ is medium then y is large.

The following sub-functions must be achieved in a circuit for this exemplary fuzzy rule set:

Fuzzification: graphing the input values relative to the linguistic variables, i.e. calculation of the values of the membership functions of each and every input quantity for the individual terms of the relevant linguistic variables. The formation of the complement of the identified value may possibly be necessary.

Calculation of minimums (as realization of the logical AND) and maximums (as realization of the logical OR) of the activated linguistic variables operated with one another.

Superimposition of the activated output terms and formation of the areal center of gravity of their area.

Preprocessing of the input signal and a unit signal/ reference signal that is also required are necessary before the actual processing, specifically for the illustrated, analog circuit realization of the fuzzy logic operations. Since work is carried out with current signals rather than with voltage signals, these must be duplicated sufficiently often before their further-processing. Moreover, some currents are required in a positive flow direction, while other currents are required in negative flow direction for the further processing.

Figure 3:
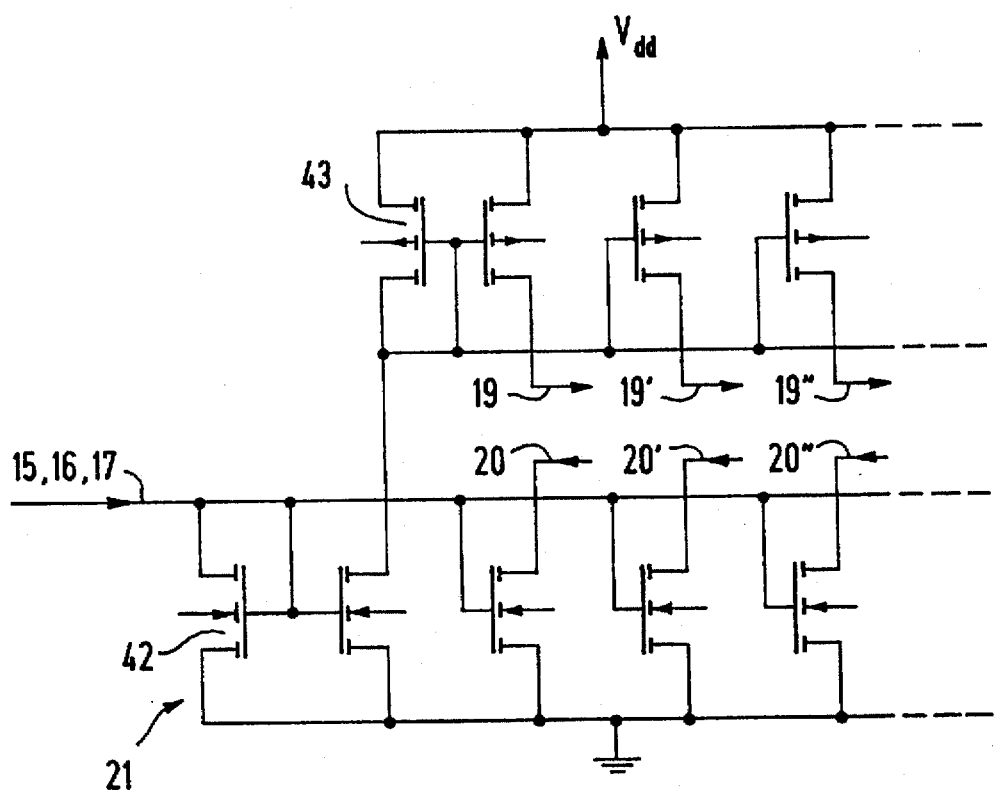
FIG. 3 shows a current mirror circuit that multiply forms an input current signal and a unit current signal (reference signal) for the fuzzification components of the fuzzy logic controller in both flow directions.

Both the duplicating as well as the directional reversal ensue with current mirror circuits such as the current mirror circuit 21 according to FIG. 3. The current mirror circuit 21 is constructed using N-MOS transistors 42 and P-MOS transistors 43. According to the invention, each of the signals 15, 16, 17 supplied to the fuzzification stage 7 is supplied to a current mirror circuit 21 and is converted into a plurality of current signals 19, 19' and 19" of identical size having the same current direction as well as current signals 20, 20' and 20" having the opposite current direction. Vdd in the drawing indicates the circuit terminal to the supply voltage, whereby the current mirror circuit 21 is known.

Figure 4:
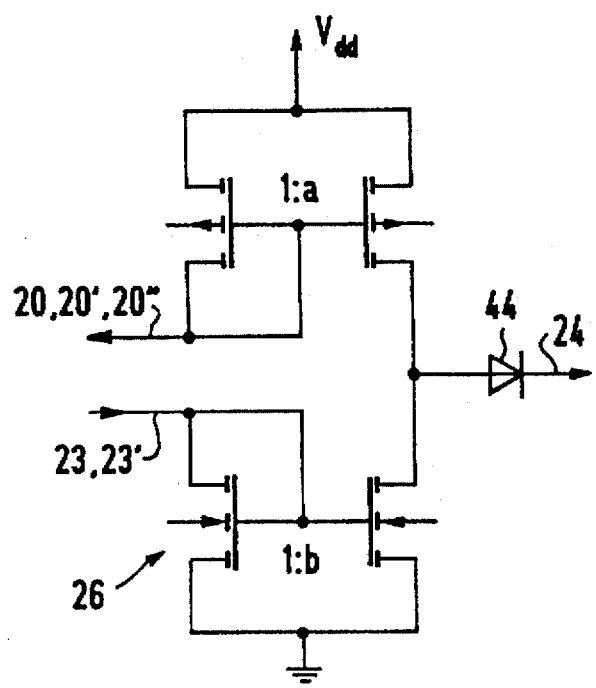
FIG. 4 is a circuit of the fuzzy logic controller for processing current signals and unit current signals for forming the linguistic terms.
Figure 6:
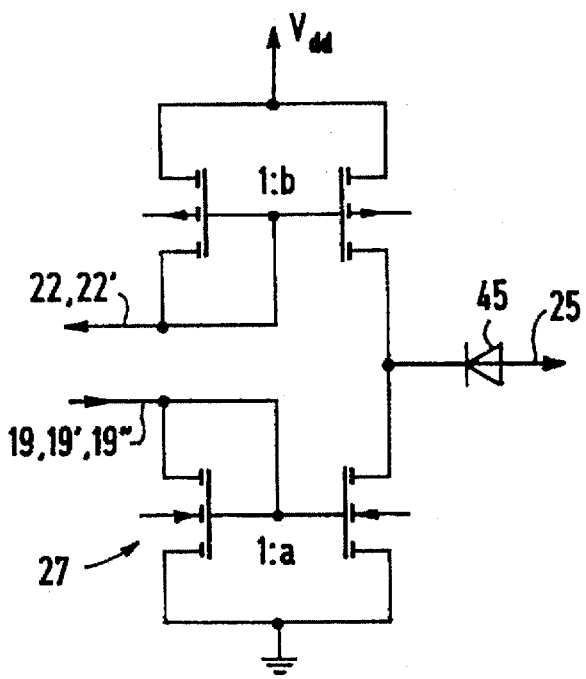
FIG. 6 is a further circuit of the fuzzy logic controller for processing current signals and unit current signals for the formation of the linguistic terms.

The fuzzification (identification of the degree of membership of the input signal relative to the individual terms of the linguistic variables) ensues in the fuzzification stage 7 with the two circuits 26 and respectively 27 shown in FIGS. 4 and 6. Each of the two circuits 26 and 27 thereby realizes a sub-segment of the membership function.

The functioning of the circuits 26 and 27 is as follows.

Figure 5:
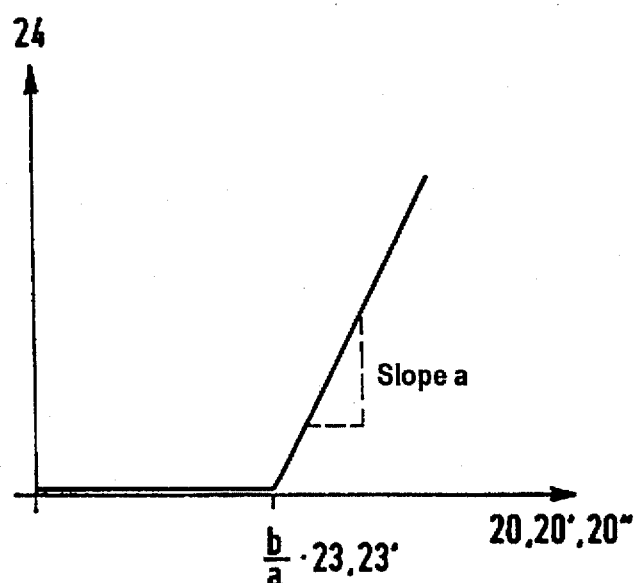
FIG. 5 is a graph of an input quantity relative to sub-segment of a linguistic term, as occurs with the circuit according to FIG. 4.
Figure 7:
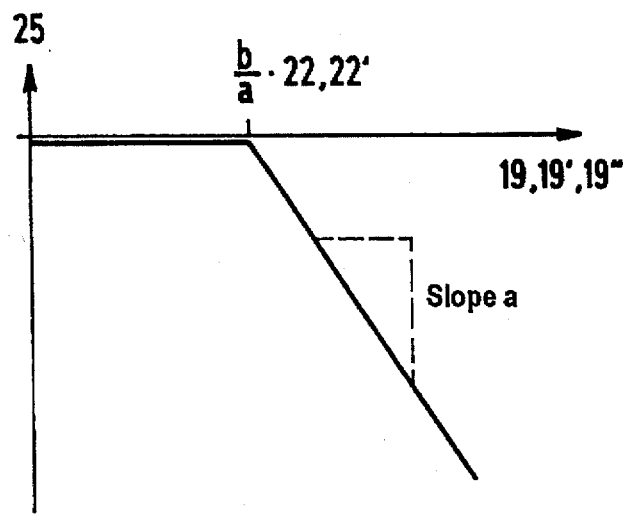
FIG. 7 is a graph of an input quantity relative to sub-segment of a linguistic term as occurs with the circuit of FIG. 6.

Unit current signals 22, 22' or 23, 23' are respectively supplied to the transistor circuits 26, 27. A predetermined unit current signal/reference signal can thereby be duplicated into corresponding unit current signals 22, 22' or 23, 23' via a current mirror of this type. The unit current value of these reference current signals corresponds to the maximum value 1 of the current signals 19, 19', 19" or 20, 20', 20". By a corresponding dimensioning of the current mirrors 26, 27 (design of the transistor size relationships) the supplied current signals 19, 19', 19" or 20, 20', 20" are mirrored from the input side onto the output side in the ratio 1:a and the unit current signals 22, 22' or 23, 23' are mirrored in the ratio 1:b. Due to the blocking effect of the diodes 44 or 45 in one direction, the current transfer relationships respectively shown in FIGS. 5 and 7 arise. The quantities a and b represent the transistor size relationships in the circuits 26, 27. At the same time, the quantities a and b appear in the characteristics of FIGS. 5 and 7 that belong to the circuits 26, 27. In accord therewith, the respective output values 24, 25 of the current in the circuits 26 and 27 are equal to zero until the value of the current of the supplied current signals 19, 19', 19" or 20, 20', 20" exceeds the value (b/a)·(22, 22') or, respectively, the value (b/a)·(23, 23'). The output values 24, 25 of the current then increase linerally with the slope a, or decrease linerally with the slope a. The design of the transistor size relationships a or b of the transistor circuit constructed with N-MOS and P-MOS transistors defines the curve of the respective output value 24 or 25 of the current. On the basis of a superimposition of the sub-segments formed by the circuits 26 and 27 (which corresponds to connecting the respective, correspondingly dimensioned circuit parts in parallel), every desired membership function can be approximated from straight segments. The circuit outlay decreases as the the approximation becomes coarser, i.e. as fewer straight segments are employed.

Figure 8:
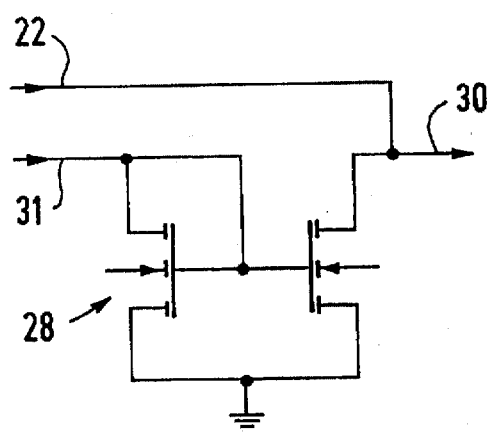
FIGS. 8 and 9 are respective embodiments of a current mirror circuit for forming the complement given a negation in the rule set to be implemented, which follow either of the circuits of FIGS. 4 or 6.
Figure 9:
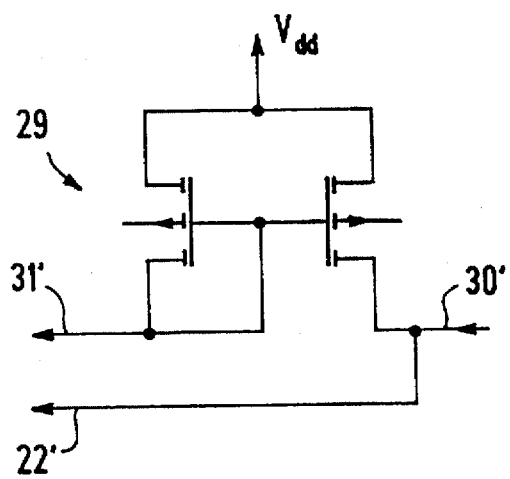

When a negation in the rule set requires the formation of a complement of one or more such membership values, this can ensue by the above-described circuit groups being followed by one of the circuits according to FIGS. 8 or 9. According to FIGS. 8 and 9, the output value 30 or 30' of the current of the respective current mirror circuit 28 or 29 is derived from the difference between the unit or reference current 22, 22' and an input current signal 31, 31'. For example, the output value 30 of the current derives from the unit current/reference current 22 minus the value of the current of the input current signal 31, whereby the unit current 22 has the value 1 and the input current signal 31 has a value between 0 and 1.

Figure 10:
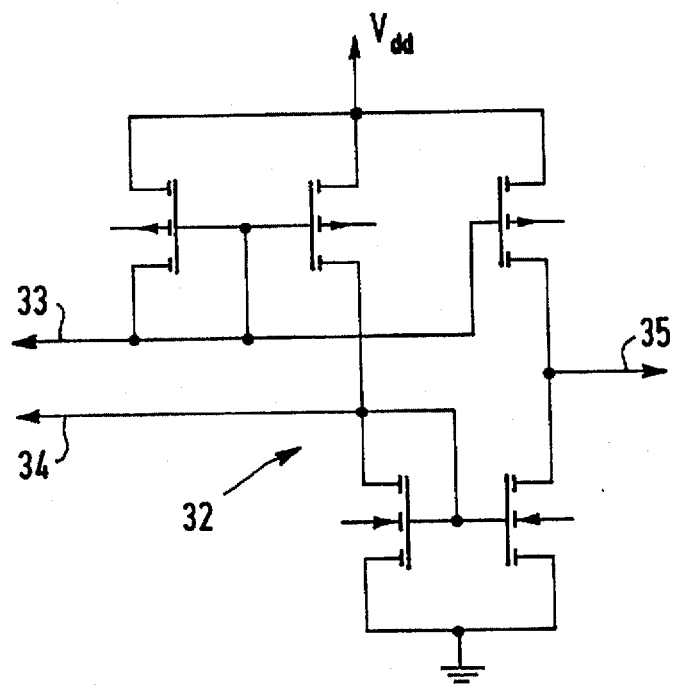
FIGS. 10 and 11 are respective circuit arrangements for realizing the logic operations AND and OR as minimum and maximum formation.
Figure 11:
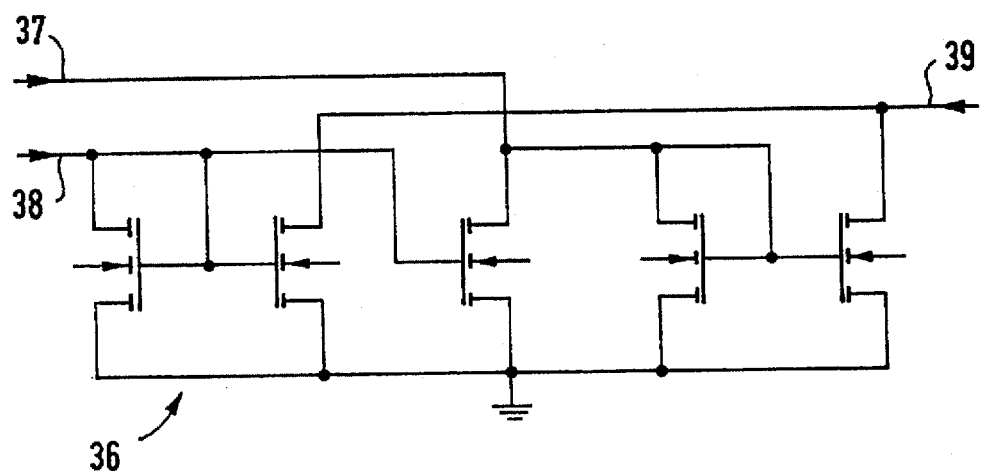

Inference Formation:

When, as is usually standard, the two logic operations AND and OR are realized as minimum and maximum formation, then the respective circuits 32 and 36 of FIGS. 10 and 11 can be employed for this purpose. The respective current output signals 35 or 39 of the circuit 32 of FIG. 10 or of the circuit 36 of FIG. 11 each represent the minimum (FIG. 10) or the maximum (FIG. 11) of the two current input signals 33, 34 or 37, 38. When more than two input quantities are to be processed, the circuits can then be correspondingly cascaded.

Figure 12:
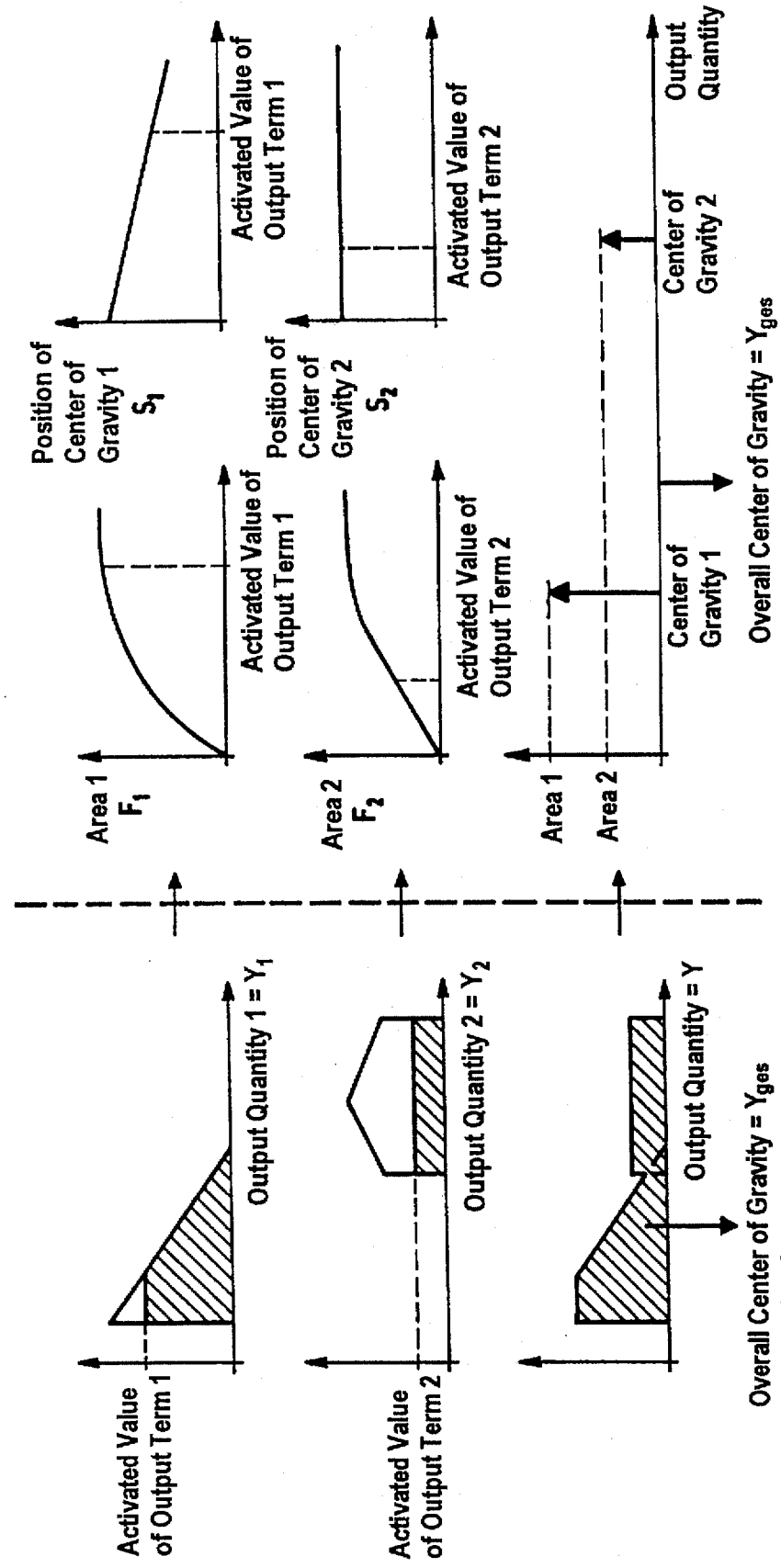
FIG. 12 illustrates the superimposition of the activated output terms and the formation of their (area) center of gravity with two calculation formulas.

Defuzzification (superimposition of the activated output terms and formation of the center of gravity of the area):

This operation can be implemented in digitally realized fuzzy logic systems with the assistance of an algorithm. For conversion into analog circuitry as is used in the deffuzification stage 9 by contrast, a switch to a different formal presentation of these operation steps is necessary, as shown in FIG. 12. The activation of an output term actually supplies two values, namely the activated area of the output term and the center of gravity of that area. The two quantities can therefore also be separately presented, namely as two separate functions of a common variable. They can then be realized in circuitry exactly like the above-explained membership functions. The superimposition of the activated output terms and the formation of their common center of gravity (defuzzified output value) then occurs on the basis of the arithmetic operation recited in FIG. 2 according to the equation $$Y_{ges} = \frac{\sum_{n=1}^{N} S_n \cdot F_n}{\sum_{n=1}^{N} F_n},$$

wherein $Y_{ges}$=crisp output value (overall center of gravity)

$S_n$=center of gravity position of the $n^{th}$ activated output term $F_n$=area of the $n^{th}$ activated output term N=total number of all output terms.

Two values are formed thereafter. The first value is derived from the sum of all activated areas each multiplied by the respective center of gravity of the activated area. The second value is the sum of all activated areas. When the first value is divided by the second value, the output value to be calculated arises. The operations for the multiplication and division can be realized with standard circuits of analog technology. The additions of the currents ensue in the circuit nodes.

The reversal of the flow direction of the current signal can be required in the overall signal path of the fuzzy logic controller at some interfaces between the circuit blocks shown here. This is realized by employing conventional current mirrors.

The inventive control function in the amplifier and transmission circuit of a programmable hearing aid constructed on the principle of fuzzy logic is particularly distinguished by the following advantages. There are improved possibilities in setting the desired control characteristic of function blocks such as AGC, PC, automatic volume control of the hearing aid, among others, by introducing non-linear parts. Different input quantities can be involved in the control characteristic in a simple and exactly definable way.

Although modifications and changes may be suggested by those skilled in the art, it is the intention of the inventors to embody within the patent warranted hereon all changes and modifications as reasonably and properly come within the scope of their contribution to the art.

I claim as my invention:

1. A programmable hearing aid comprising:

a microphone for receiving incoming audio signals;

amplifier and transmission means, connected to said microphone, for operating on said audio signals received by said microphone to amplify and transmit said audio signals with settable transmission characteristics, to correct a hearing deficiency determined by a plurality of control functions;

an earphone, connected to said amplifier and transmission means, for emitting an audio signal operated on by said amplifier and transmission means; and fuzzy logic controller means, contained in said amplifier and transmission means, for performing at least some of said control functions according to fuzzy logic for continuously and automatically maintaining said transmission characteristics at respective settings for correcting said hearing deficiency said fuzzy logic controller means comprising fuzzification means for fuzzification of said preprocessed signals to produce fuzzified signals, said fuzzification means having a current mirror circuit means, to which each preprocessed signal is supplied, for converting each preprocessed signal into a first signal having a magnitude and a current direction and a second signal having the same magnitude and an opposite current direction; and a housing having a size and shape allowing said housing to be worn at an ear of a person having said hearing deficiency, said housing containing said microphone, said amplifier and transmission means and said earphone.

2. A programmable hearing aid as claimed in claim 1 wherein said amplifier and transmission means comprises automatic gain control circuit means, connected to said fuzzy logic controller means, for automatically controlling a gain of said amplifier and transmission means according to fuzzy logic.

3. A programmable hearing aid as claimed in claim 1 wherein said amplifier and transmission means comprises automatic volume control means, connected to said fuzzy logic controller means, for automatically controlling a volume of the audio signal to be supplied to said earphone according to fuzzy logic.

4. A programmable hearing aid as claimed in claim 1 wherein said amplifier and transmission means includes a plurality of channels for respectively amplifying and transmitting different components of said audio signals from said microphone in different frequency ranges, and wherein said fuzzy logic controller means is connected to each of said frequency channels for controlling amplification and transmission in each channel according to fuzzy logic.

5. A programmable hearing aid as claimed in claim 1 wherein said fuzzy logic controller means comprises, in addition to said fuzzification means:

fuzzy inference formation means, supplied with said fuzzified signals, for forming a control signal for each control function to be controlled according to fuzzy logic; and defuzzification means for defuzzification of said fuzzy signals from the inference means.

6. A programmable hearing aid as claimed in claim 5 wherein said signal preprocessing means comprises means for rectifying said audio signals from said microphone.

7. A programmable hearing aid as claimed in claim 5 wherein said signal preprocessing means comprises means for averaging said audio signals from said microphone.

8. A programmable hearing aid as claimed in claim 5 wherein said signal preprocessing means comprises means for time differentiating said audio signals from said microphone.

9. A programmable hearing aid as claimed in claim 5 wherein said fuzzification means, said inference formation means and said defuzzification means comprise, in combination, a hardware implementation of the set of rules of the fuzzy logic controller.

10. A programmable hearing aid as claimed in claim 5 wherein said hearing aid is operable in a plurality of operating modes and with a plurality of operating programs and comprises a battery for supplying power to said microphone, said amplifier and transmission means and said earphone, and further comprising means for supplying signals to said fuzzification means identifying at least one of a current operating mode, a current operating program and a battery condition, and wherein said fuzzification means comprises means for employing said at least one of said signals in the fuzzification of said preprocessed signals.

11. A programmable hearing aid as claimed in claim 5 wherein said inference formation means comprises an analog circuit.

12. A programmable hearing aid as claimed in claim 11 wherein said inference forming means includes means for performing a logic AND function by forming a minimum of input signals to said means for performing a logic AND function.

13. A programmable hearing aid as claimed in claim 11 wherein said inference formation means includes means for performing a logic OR function by forming a maximum of input signals supplied to said means for performing a logic OR function.

14. A programmable hearing aid as claimed in claim 5 wherein said defuzzification means comprises an analog circuit.

15. A programmable hearing aid as claimed in claim 14 wherein said defuzzification means comprises means for forming crisp output values $Y_{ges}$ which comprise an overall center of gravity of a plurality of activated linguistic terms from said inference formation means according to the expression $$Y_{ges} = \frac{\sum_{n=1}^{N} S_n \cdot F_n}{\sum_{n=1}^{N} F_n},$$

wherein $S_n$ = center of gravity position of the $n^{th}$ activated output term $F_n$ = area of the $n^{th}$ activated output term N = plurality of all output terms.

16. A programmable hearing aid as claimed in claim 1 wherein said fuzzification means includes means for generating a reference signal, reference signal current mirror means for converting said reference signal into a plurality of unit current signals, and means for combining said first and second signals and said unit current signals to form a plurality of output current values, and means for superimposing said output current values to form linguistic terms of said fuzzy logic controller means.

17. A programmable hearing aid as claimed in claim 16 further comprising complement-forming mirror circuit means for forming complement of any of said linguistic terms which have a negative value.

* * * * *